US 9,667,263 B1

(12) United States Patent
Chao

(10) Patent No.: US 9,667,263 B1
(45) Date of Patent: May 30, 2017

(54) APPARATUS AND METHOD OF SELF-HEALING DATA CONVERTERS

(71) Applicant: Yuan-Ju Chao, Cupertino, CA (US)

(72) Inventor: Yuan-Ju Chao, Cupertino, CA (US)

(*) Notice: Subject to any disclaimer, the term of this patent is extended or adjusted under 35 U.S.C. 154(b) by 0 days.

(21) Appl. No.: 15/287,560

(22) Filed: Oct. 6, 2016

(51) Int. Cl.
*H03M 1/06* (2006.01)
*H03M 1/10* (2006.01)

(52) U.S. Cl.
CPC ........... *H03M 1/06* (2013.01); *H03M 1/1009* (2013.01); *H03M 1/1033* (2013.01); *H03M 1/1071* (2013.01); *H03M 1/1085* (2013.01)

(58) Field of Classification Search
None
See application file for complete search history.

(56) References Cited

U.S. PATENT DOCUMENTS

| | | | | |
|---|---|---|---|---|
| 4,272,760 | A * | 6/1981 | Prazak | H03M 1/1071 341/120 |
| 6,281,818 | B1 * | 8/2001 | Miller | H03M 1/1038 341/118 |
| 6,850,125 | B2 * | 2/2005 | Norman | G01K 15/00 331/65 |
| 7,696,768 | B2 * | 4/2010 | Greenberg | G01R 31/2856 324/721 |
| 7,701,376 | B2 * | 4/2010 | Oshima | H03M 1/1004 341/155 |
| 2002/0105353 | A1 * | 8/2002 | Mori | H03M 1/1071 324/750.01 |
| 2004/0246809 | A1 * | 12/2004 | Sutardja | H03B 5/04 365/232 |

OTHER PUBLICATIONS

Barua et al., A Built in Self Test System for Dynamic Performance Parameter Evaluation of Pipelined Analog to Digital Converter, Proceedings of the World Congress on Engineering and Computer Science 2013 vol. II WCECS 2013, Oct. 23-25, 2013, San Francisco, USA.*

* cited by examiner

*Primary Examiner* — Howard Williams
(74) *Attorney, Agent, or Firm* — Tran & Associates

(57) ABSTRACT

A self-healing data converter system including a data converter; a parametric function module coupled to the data converter to receive a target performance requirement for a data converter and produce a set of function values to the data converter; an assistant module that captures data converter performance under one or more stress conditions; and a processing module coupled to the data converter to stress the data converter in accordance with one or more predetermined parameters and based on the target performance requirement and data converter performance, the processing module determines new parameters based on a self-healing method and applies the new parameters to produce a new set of function values for the data converter until a predetermined threshold is met to adaptively self-heal the data converter to changed conditions.

17 Claims, 12 Drawing Sheets

APPARATUS AND METHOD OF SELF-HEALING DATA CONVERTERS

BACKGROUND

The present invention relates to self-healing data converters.

The increasing demand for reconfigurable system or even self-healing system arises from many reasons and conditions. First of all, the system cannot be reached or recalled anymore once they are deployed. For example, the space shuttle, the satellite in space, Mars Rover are not reachable once they are launched into the space. Secondly, the effort to retrieve or repair the system is too costly such as the equipment in the North Pole, the cellular base station in the remote desert, the gear and appliance in the isolated areas. Thirdly, the required time of identifying the root cause and restoring the system takes too long such that the damage has been done. Besides, some equipment like the semiconductor manufacturing equipment or Automatic test equipment (ATE) is fully utilized around the clock. Any downtime in the production line is not desirable. Moreover, the recent self-driving vehicles, smart devices and smart appliance also require the system adapts quickly to the environmental change.

SUMMARY

In a first aspect, a self-healing data converter system including a data converter; a parametric function module coupled to the data converter to receive a target performance requirement for a data converter and produce a set of function values to the data converter; an assistant module that captures data converter performance under one or more stress conditions; and a processing module coupled to the data converter to stress the data converter in accordance with one or more predetermined parameters and based on the target performance requirement and data converter performance, the processing module determines new parameters based on a self-healing method and applies the new parameters to produce a new set of function values for the data converter until a predetermined threshold is met to adaptively self-heal the data converter to changed conditions.

A second aspect employs Parametric Function Module, Assistant Module and Processing Module together with data converter to form a close-loop self-healing data converter. The self-healing process performs an Initialization step to load the default parameters then builds a performance matrix table with respect to overstretched voltage and temperature during Stress Test step. Finally the process computes and applies the optimal parameters during Adaptation step.

Advantages of the converter may include one or more of the following. The present self-healing data converters adjust the parameters accordingly to the process, supply voltage and temperature variation. The self-healing data converters adapt to the environmental change to meet target data converter performance. The self-healing data converter maintains the conversion with decreased performance to avoid system failing during abrupt environmental change on the device. Since Data converters (ADCs and DACs) are the critical building blocks that translate real-world or "analog" signals to and from the digital domain in electronic systems. The self healing systems necessitate the data converter can evaluate its own performance, detect the environment changes, adapt to the changes and reconfigure itself to meet the required system performance.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
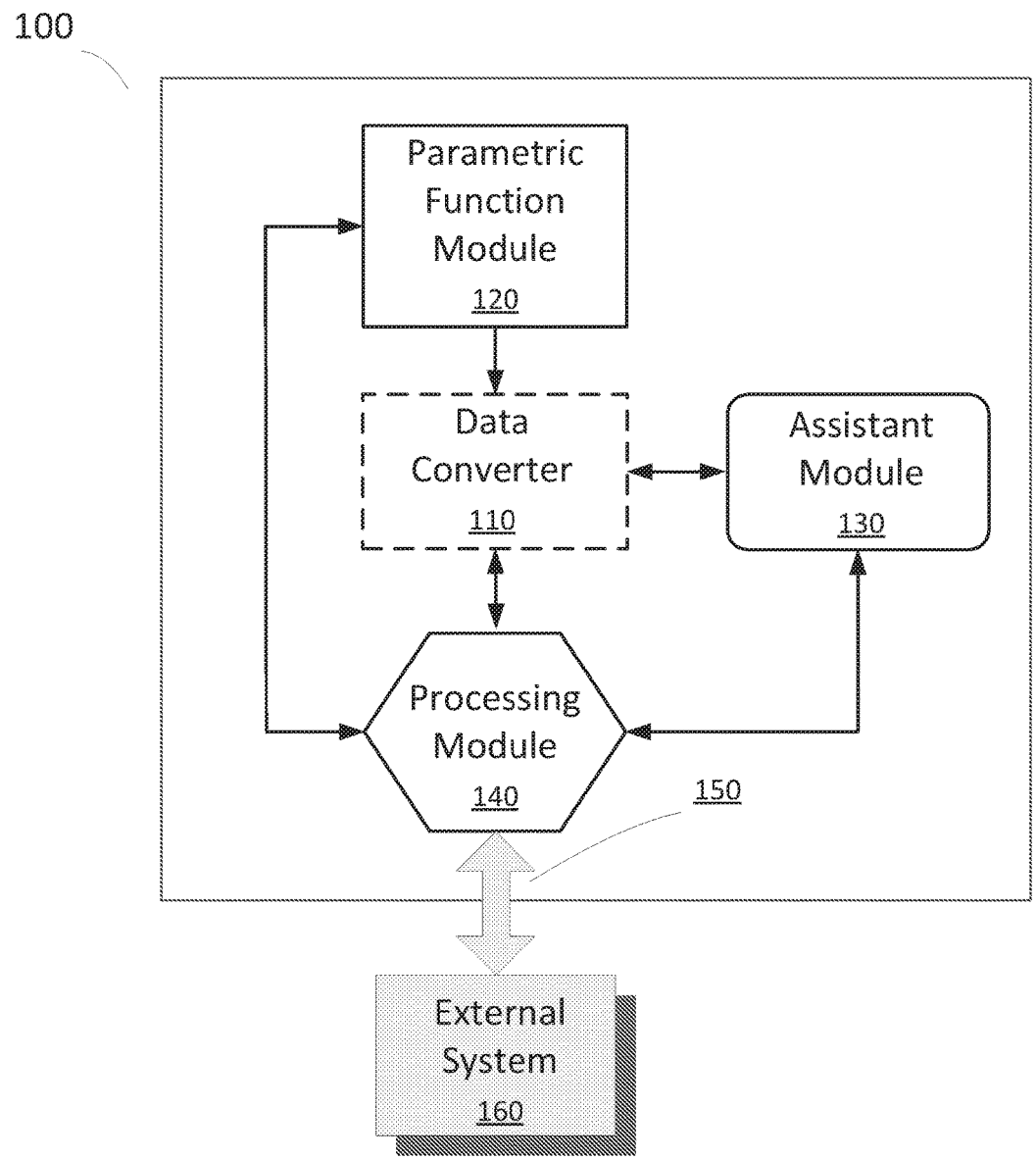
FIG. 1 illustrates the system module diagram of self-healing data converters.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Data converters are disclosed with different function modules that can detect the environmental change including process corner, supply voltage and temperature information. The data converters can assess the data converter performance and adapt to the environmental change based on a self-healing method. The data converters also adjust the performance to achieve the system robustness and avoid system malfunction.

FIG. 1 shows the system module diagram of self-healing data converters 100. The system consists of Data Converter 110, Parametric Function Module 120, Assistance Module 130 and Processing Module 140. Parametric Function Module provides the functional parameters to Data Converter 110. Assistant Module 130 interacts with Data Converter 110 to obtain data converter performance metrics. Processing Module 140 uses the performance metrics to compute optimal functional parameters. Parametric Function Module 120 then delivers the updated parameters to Data Converter 110 for improving data converter performance. Processing Module 140 communicates with External system 160 through a specific interface 150 to change the target data converter performance.

As illustrated on FIG. 1, each module is drawn in different shapes to represent their individual functionality. Data Converter 110 is in dashed rectangle. Parametric Function Module 120 is in solid rectangle. Assistant Module 130 is in curved rectangle and Processing Module 150 is in hexagon. Each module's functionality is described below.

Processing Module 140 connects with External System 160 through interface 150 and receives the target performance requirement from External System 160. Processing Module sends the default parameters to Parametric Function Module 120 and Parametric Function Module produces a set of function values to Data Converter 110. The performance of Data Converter 110 is captured and analyzed by Assistant Module 130. The analyzed result of Data Converter's performance is sent to Processing Module 140. Based on the required performance from External System and analyzed result from Assistant Module, Processing Module 140 computes new parameters based on a self-healing algorithm. Parametric Function Module 120 uses the new parameters and produces a new set of function values for Data Converter. This results in a performance change on Data Converter. The performance change is collected by Assistant Module again and delivered to Processing Module. Data Converter's performance is adjusted accordingly with the updated parameters. Processing Module continues to communicate between External System 160, Parametric Function Module 120 and Assistant Module 130 to form an adaptive self-healing data converter system.

Figure 2:
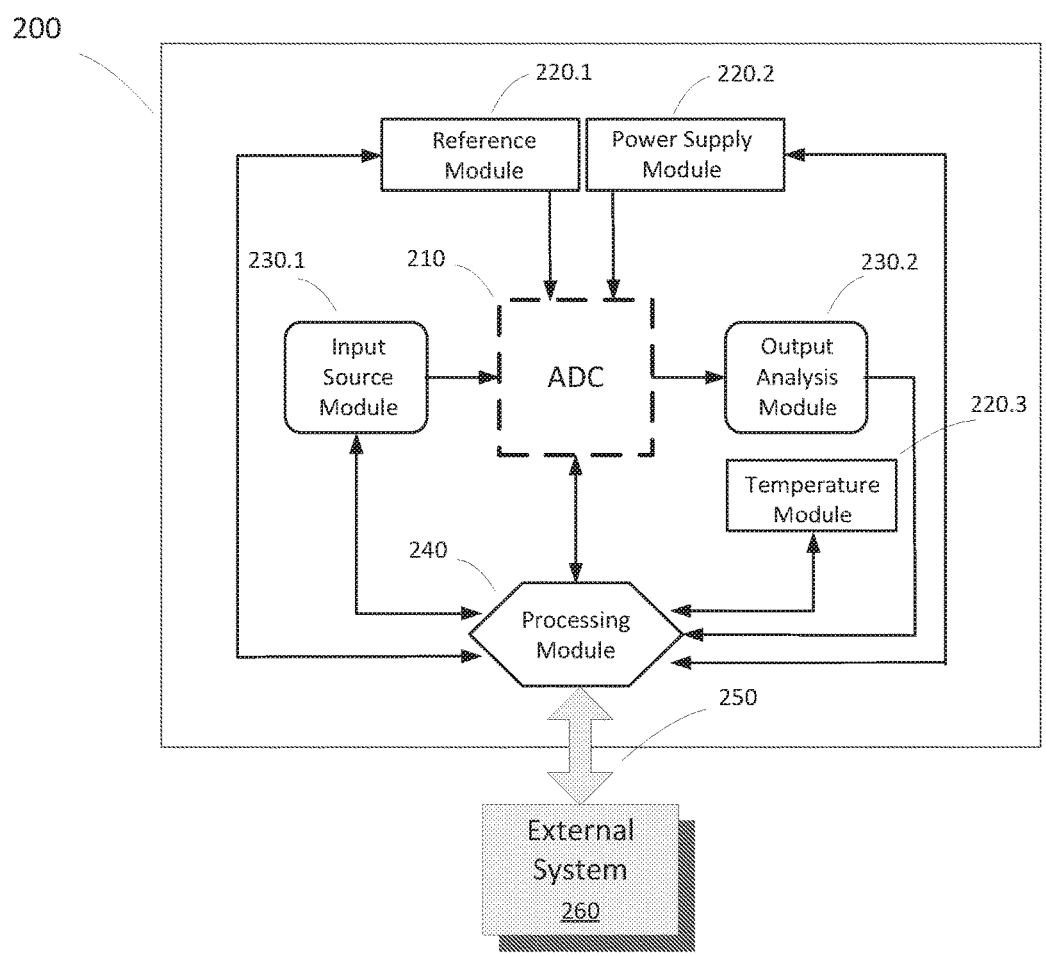
FIG. 2 is functional module diagram of the self-healing analog to digital converter (ADC).

Shown on FIG. 1 is a conceptual system module diagram, FIG. 2 illustrates more detail of the functional module diagram of the self-healing ADC 200. Similar to FIG. 1, the different modules are drawn in different shapes to represent their individual functionality. There are three Parametric Function Modules: Reference Module 220.1, Power Supply Module 220.2 and Temperature Module 220.3. And there are two Assistant Modules: Input Source Module 230.1 and Output Analysis Module 230.2. The references and power supplies of ADC 210 are provided from Reference Module 220.1 and Power Supply Module 220.2 respectively. Input Source Module 230.1 provides input signals to ADC 210 and Output Analysis Module 230.2 captures ADC's output. Processing Module 240 communicates with External System 260 through interface 250. All the modules including Temperature Module 220.3 are all connected to Processing Module 240. The information from different modules are analyzed and processed in Processing Module 240 based on a self-healing algorithm.

Initially, Processing Module 240 loads the target ADC performance and ADC default parameters from External system 260 via Interface 250. Reference Module 220.1, Power Supply Module 220.2 and Temperature Module 220.3 receive the initial parameters from Processing Module 240 and produce needed references, supply voltages and temperature to ADC 210. Processing Module 240 also commands Input Source Module 230.1 send a known input signal to ADC. Output Analysis Module 230.2 captures the ADC output and delivers the analyzed result back to Processing Module. Processing Module compares the difference of the input signal and analyzed result then start computing the new parameters based on an embedded self-healing algorithm. The new parameters are delivered to Parametric Function Modules: Reference Module 220.1, Power Supply Module 220.2 and Temperature Module 220.3. These three modules produce updated references, supply voltages and temperature to adjust ADC's performance.

Figure 3:
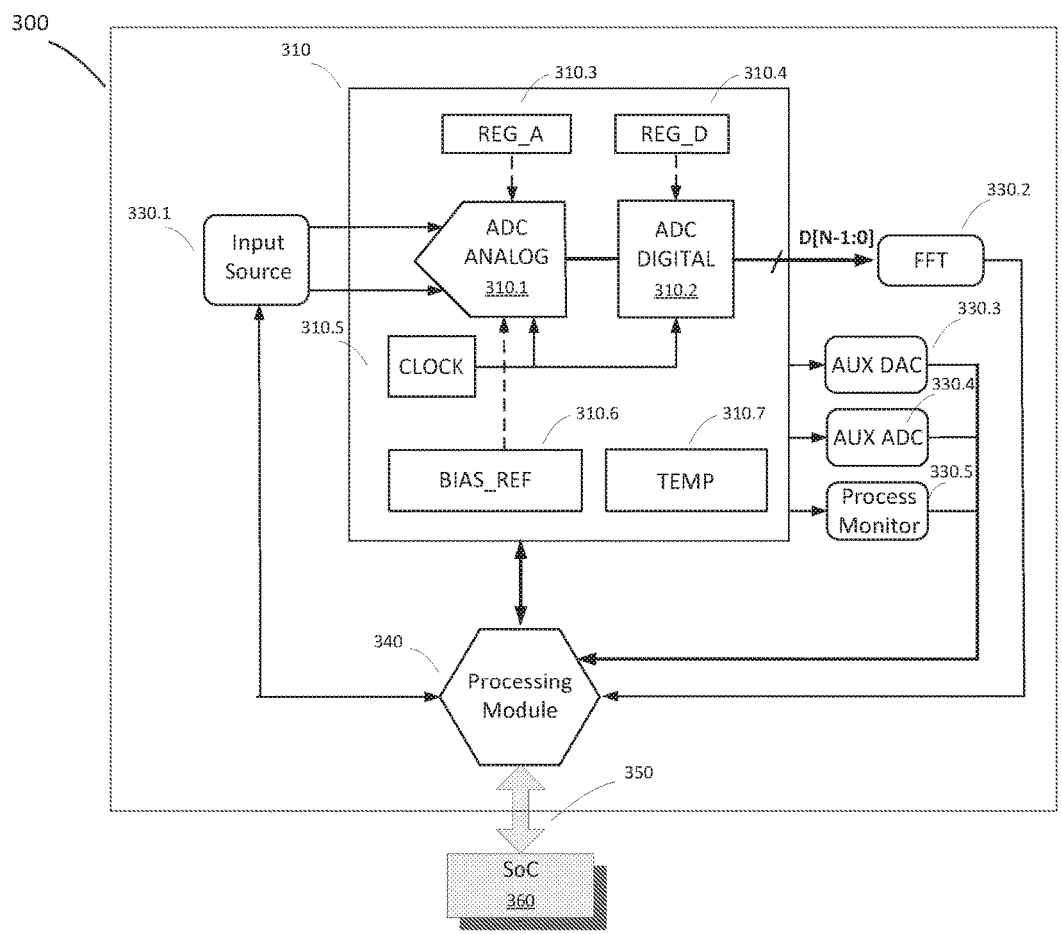
FIG. 3 is an example embodiment block diagram of the self-healing N-bit ADC.

FIG. 3 illustrates an example embodiment block diagram of a self-healing N-bit ADC 300. Similarly to previous figures, the Parametric Function Module is drawn in solid rectangle. Assistant Module is drawn in curved rectangle and Processing Module is in hexagon.

ADC 310 consists of a few function blocks. ADC ANALOG 310.1 and ADC DIGITAL 310.2 represent the analog portion of ADC and digital portion of ADC respectively. There are five Parametric Function Modules inside ADC 310: REG_A 310.3, REG_D 310.4, CLOCK 310.5, BIAS_REF 310.6 and TEMP 310.7. REG_A 310.3 and REG_D 310.4 represent the voltage supply regulators for ADC ANALOG 310.1 and ADC DIGITAL 310.2. CLOCK 310.5 represents the clocking generation for ADC. BIAS_REF 310.6 represents the bias current/voltage generation and reference voltage/current generation circuitry. TEMP 310.7 represents a temperature module that can adjust the silicon temperature.

There are five Assistant Modules: Input Source 330.1, FFT 330.2, AUXDAC 330.3, AUXADC 330.4 and Process Monitor 330.5. Input Source 330.1 represents the input signal generation. FFT 330.2 represents Fast Fourier Transform algorithm. AUXDAC 330.3 represents a N+1 bit low speed auxiliary DAC. AUXADC 330.4 represents a N+1 bit low speed auxiliary ADC. Process Monitor 330.5 represents a monitor circuitry that tracks the process corner information.

All the modules are connected to Processing Module 340 that governs the operation and communicates with SoC (System on Chip) 360 through interface 350. Processing Module 340 starts the operation by loading the ADC default parameters from SoC. The default parameters are first delivered to all the Parametric Function Modules and each module produces associated function values to ADC ANALOG and ADC DIGITAL. These function values could be voltage, current, timing information or temperature coefficient that ADC required to execute the analog to digital conversion. Next, Processing Module instructs Input Source 330.1 to generate input signals and the ADC 310 output codes D[N−1:0] are fed into FFT 330.2 for output signal analysis. Simultaneously, AUXDAC, AUXADC and Process Monitor collect related information from ADC including amplifier current, bias voltage, references, supply voltage, clock delay, temperature and process corner etc. Based on the collected information from ADC input, ADC analyzed output and SoC, the Processing Module algorithm analyzes, computes then issue a new set of parameters. With the new parameters, the five Parametric Function Modules produce an updated function values that result in a change of ADC performance. The change of ADC performance is sampled again by the Assistant Modules and sent to Processing Module. Depending on the algorithm, Processing Module may continue to update the parameters to adjust the ADC performance until a target number has been reached or freeze the parameters when certain criteria has been fulfilled.

Figure 4:
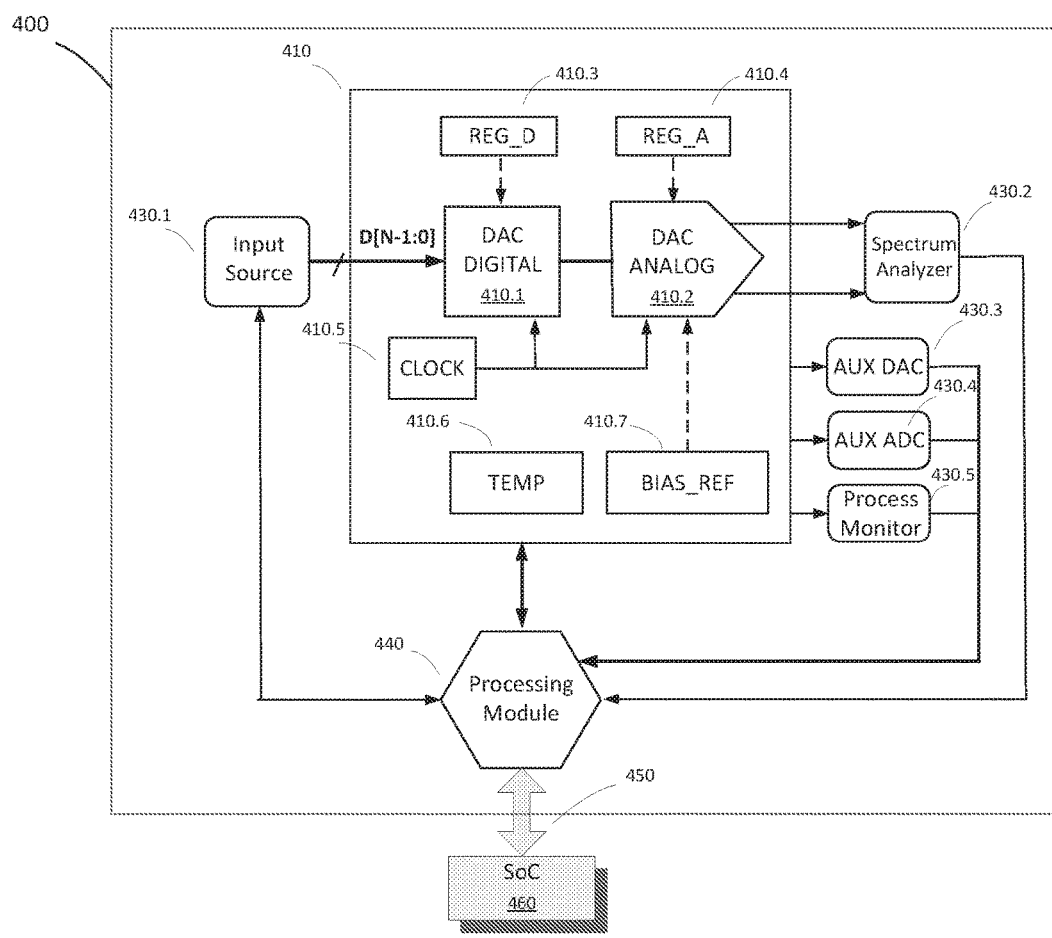
FIG. 4 is an example embodiment block diagram of the self-healing N-bit DAC.

FIG. 4 illustrates an example embodiment block diagram of a self-healing N-bit DAC 400. DAC 410 consists of a few function blocks. DAC DIGITAL 410.1 and DAC ANALOG 410.2 represent the digital portion of DAC and analog portion of DAC respectively. There are five Parametric Function Modules inside DAC 410. REG_D 410.3 represents the digital supply regulator for DAC DIGITAL 410.1. REG_A 410.4 represents the analog supply regulator for DAC ANALOG 410.2. CLOCK 410.5 represents the clocking generation for DAC. BIAS_REF 410.7 represents the bias current/voltage generation and reference voltage/current generation circuitry. TEMP 410.6 represents a temperature module that can adjust the silicon temperature.

There are five Assistant Modules in FIG. 4. Input Source 430.1 represents the input signal generation. Spectrum Analyzer 430.2 represents an on-chip spectrum analyzer for harmonic distortion characterization. AUXDAC 430.3 represents a N+1 bit low speed auxiliary DAC. AUXADC 430.4 represents a N+1 bit low speed auxiliary ADC. Process Monitor 430.5 represents a monitor circuitry that tracks the wafer process information.

Figure 5:
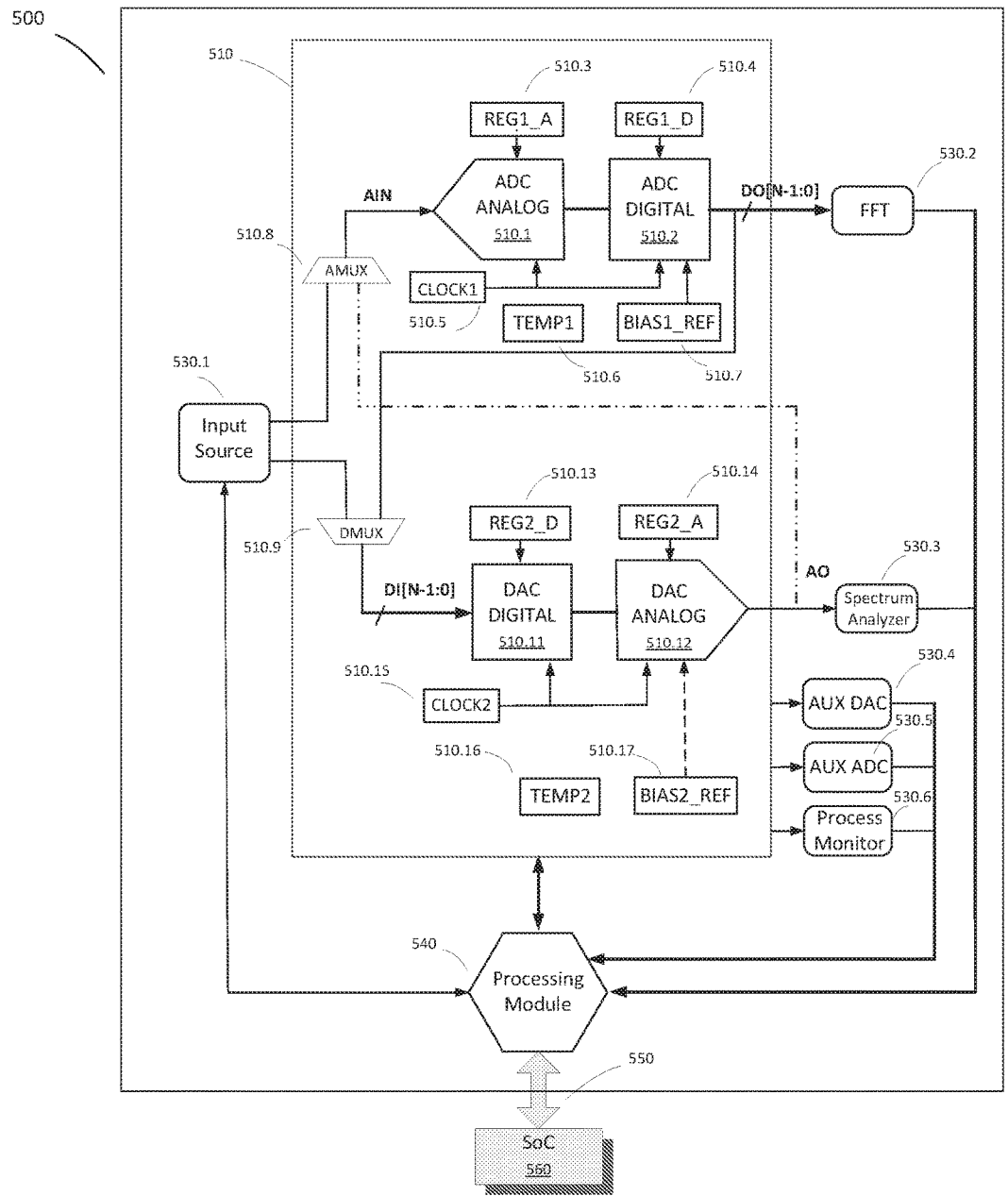
FIG. 5 is an example embodiment block diagram of the self-healing N-bit data converter sub-system.

System may require that ADC and DAC be placed together to become a data converter sub-system. FIG. 5 illustrates an example embodiment block diagram of a self-healing N-bit data converter sub-system 500. It consists of N-bit Data Converter 510, Processing Module 540 and a few Assistant Modules. Data Converter 510 is formed by two main components: N-bit ADC and N-bit DAC. ADC ANALOG 510.1 represents ADC analog portion and ADC DIGITAL 510.2 represent ADC digital portion. REG1_A 510.3 and REG1_D 510.4 are supply regulators for ADC ANALOG and ADC DIGITAL. CLOCK1 510.5, TEMP1 510.6 and BIAS1_REF 510.7 represent the clock generation, temperature module and references for N-bit ADC. On the DAC's portion, DAC DIGITAL 510.11 and DAC ANALOG 510.12 represent DAC digital portion and DAC analog portion. REG2_D 510.13 and REG2_A 510.14 are the supply regulators for DAC DIGITAL and DAC ANALOG. CLOCK2 510.15, TEMP2 510.16 and BIAS2_REF 510.17 represent the clock generation, temperature module and references for N-bit DAC. Besides N-bit Data Converter 510, Input Source 530.1, FFT 530.2 and Spectrum Analyzer 530.3 provide input signals and capture digital output and analog output correspondingly. AUXDAC 530.4, AUXADC 530.5 and Process Monitor 530.6 are auxiliary ADC, auxiliary DAC and process tracking functional circuitry respectively.

One unique feature of data converter sub-system 500 is that ADC and DAC forms a loopback configuration to enable direct performance assessment at its normal operational conversion rate. ADC output DO[N−1:0] can become DAC's input DI[N−1:0] by configuring DMUX 510.9. Similarly, DAC output AO can become ADC's input AIN by configuring AMUX 510.8. Although AUXDAC and AUXADC can also be used to monitor ADC and DAC's outputs, the sampling rate of AUXDAC and AUXADC are lower than ADC and DAC conversion rate. Hence, only the static performance of the data converters can be obtained. Often 2 extra bits is required for [N+1] bit auxiliary data converters to sample signal path [N−1] bit data converters in order to provide accurate samples. This loopback feature enables on-the-fly measurement of the ADC or DAC performance at the same conversion rate of their operation mode. The dynamic performance of data converters can be measured directly without compromise on the conversion speed using the loopback configuration.

Figure 6:
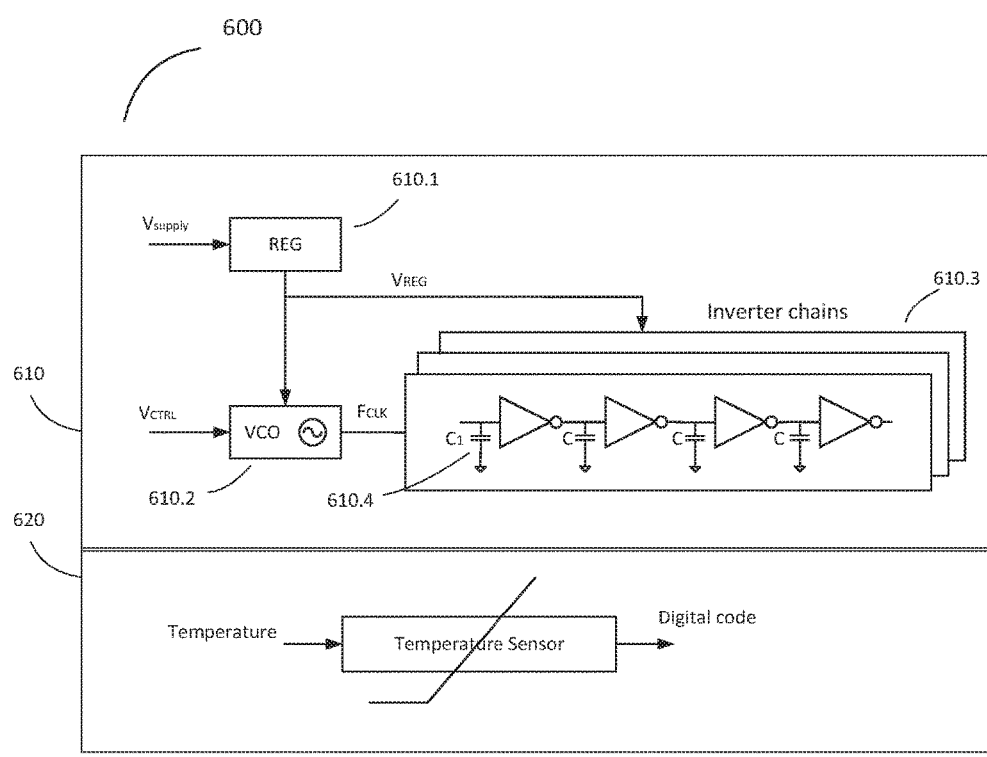
FIG. 6 shows a detailed block diagram of Temperature Module.

Temperature Module like TEMP1 or TEMP2 in FIG. 5 is responsible to deliver the designated temperature inside the silicon. FIG. 6 shows a detailed block diagram of Temperature Module 600. It consists of two components: upper half is Heat generator 610 and the lower half is Sensor 620. The heat generator 610 consists of REG 610.1, VCO 610.2 and Inverter chains 610.3. REG 610.1 is a voltage regulator that takes $V_{supply}$ input and produces regulated $V_{REG}$ output. VCO 610.2 is a voltage-controlled oscillator that its output clock $F_{CLK}$ frequency varies with input control voltage $V_{CTRL}$. Inverter chains 610.3 are multiple inverter chains that take $F_{CLK}$ as input and operate under $V_{REG}$ supply voltage. Sensor 620 is temperature sensor that it can convert the temperature to a digital code. The digital code represents the temperature information and is sent to the self-healing algorithm for further processing.

Temperature Module is used to change the silicon temperature. The heat source comes from the power dissipation of the inverter chains. The power dissipation of an inverter running at certain clock frequency can be described as the following equation:

$$P = 0.5 * f * C * V^2$$

P is the power dissipation
f is clock frequency
C is capacitance
V is supply voltage Initially, Temperature Module loads the default parameters of $V_{supply}$, $V_{CTRL}$ and $V_{REG}$, then VCO 610.2 generates clock $F_{CLK}$. The multiple inverter chains operate at $F_{CLK}$ frequency to charge and discharge the capacitance like $C_1$ 610.4. The power dissipation of multiple inverter chains is transferred and become heat in the silicon. The more power dissipation of the multiple inverter chains, the higher silicon temperature. The self-healing algorithm can increase the power dissipation and increase the silicon temperature by increasing $V_{CTRL}$ voltage or $V_{REG}$ voltage. Conversely, decreasing $V_{CTRL}$ voltage or $V_{REG}$ voltage will reduce the power dissipation of multiple inverter chains and results in the decrease in the temperature.

Figure 7:
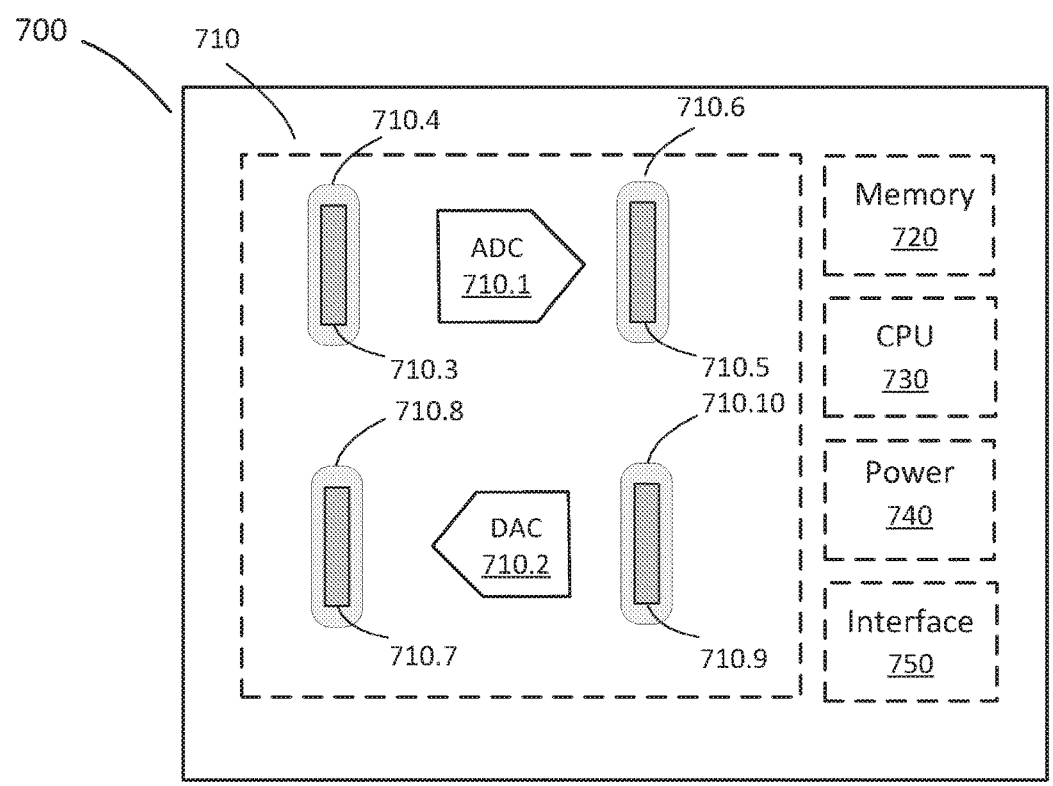
FIG. 7 shows an example embodiment placement of Temperature Module in SoC.

During the physical implementation, Temperature Module needs to be placed in a deep N well and close to data converters. FIG. 7 illustrates an example embodiment placement of Temperature Module in SoC 700. SoC chip may consist of different functional block including data converters 710, Memory 720, CPU 730, Power Management 740 and Interface 750. Note that the block diagram is not drawn to scale. There are ADC 710.1 and DAC 710.2 inside data converters 710. There are four isolated Deep N wells 710.4, 710.6, 710.8, 710.10 and they are drawn in rounded rectangle. There are four Temperature Modules 710.3, 710.5, 710.7 and 710.9 and they are drawn in solid rectangle. As shown in FIG. 7, Temperature Module 710.3, 710.5, 710.7 and 710.9 are placed inside of deep N well 710.4, 710.6, 710.8 and 710.10 correspondingly. Deep N well is a fully isolated well that it can absorb the noise generated from inverter chains. Without the deep N well, the noise from the inverter chains could couple to the data converter and decrease its SNR performance. Temperature Module should be placed close to its corresponding data converter so the heat it generates can affect the data converter circuitry and also the temperature it sensed reflects the temperature nearby the data converter.

The system module diagram and the functional module diagram of self-healing data converters have been illustrated on FIG. 1 and FIG. 2. The example embodiment block diagram of a self-healing N-bit ADC, N-bit DAC and N-bit data converter sub-system are illustrated on FIG. 3, FIG. 4 and FIG. 5 respectively. FIG. 1 to FIG. 5 illustrated the hardware functional diagram of the self-healing data converters. These hardware functional blocks are controlled and configured by the self-healing algorithm that is to be described below.

Figure 8A:
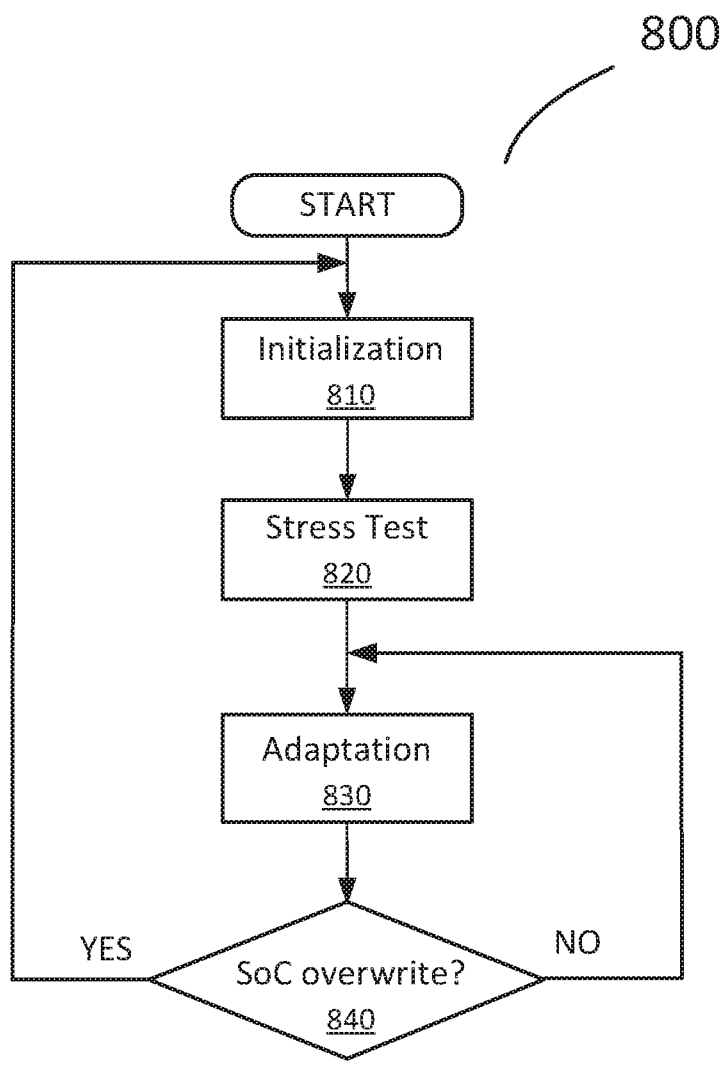
FIG. 8A shows the flowchart of self-healing data converter process.

FIG. 8A illustrates the flowchart of self-healing data converter algorithm 800. There are three execution steps: Initialization step 810, Stress Test step 820 and Adaptation step 830. It starts with the Initialization step 810 which it loads initial parameter values. Then it enters Stress Test step that the environment is stressed to obtain the converter performance with respect to the environmental change. After Stress Test step, it goes to Adaptation step 830 which the data converter performance is adapted to the environmental change. The decision step 840 determines that it goes back to Initialization step 810 if "SoC overwrite" is true or stays in the Adaptation step 830. The decision step 840 "SoC overwrite" represents that the parameters can be modified or overwritten from an external system like the host controller.

For data converter performance, there are various performance metrics such as Integral Non Linearity (INL), Differential Non Linearity (DNL), Spurious-Free Dynamic Range (SFDR), Signal-to-Noise Ratio (SNR), Total Harmonic Distortion (THD) and Effective Number of Bits (ENOB). Users choose specific performance metrics based on the system and application requirements. For illustration purpose and simplicity reason, only Effective Number of Bits (ENOB) is used to evaluate the data converter performance in the discussed self-healing algorithm.

Figure 8B:
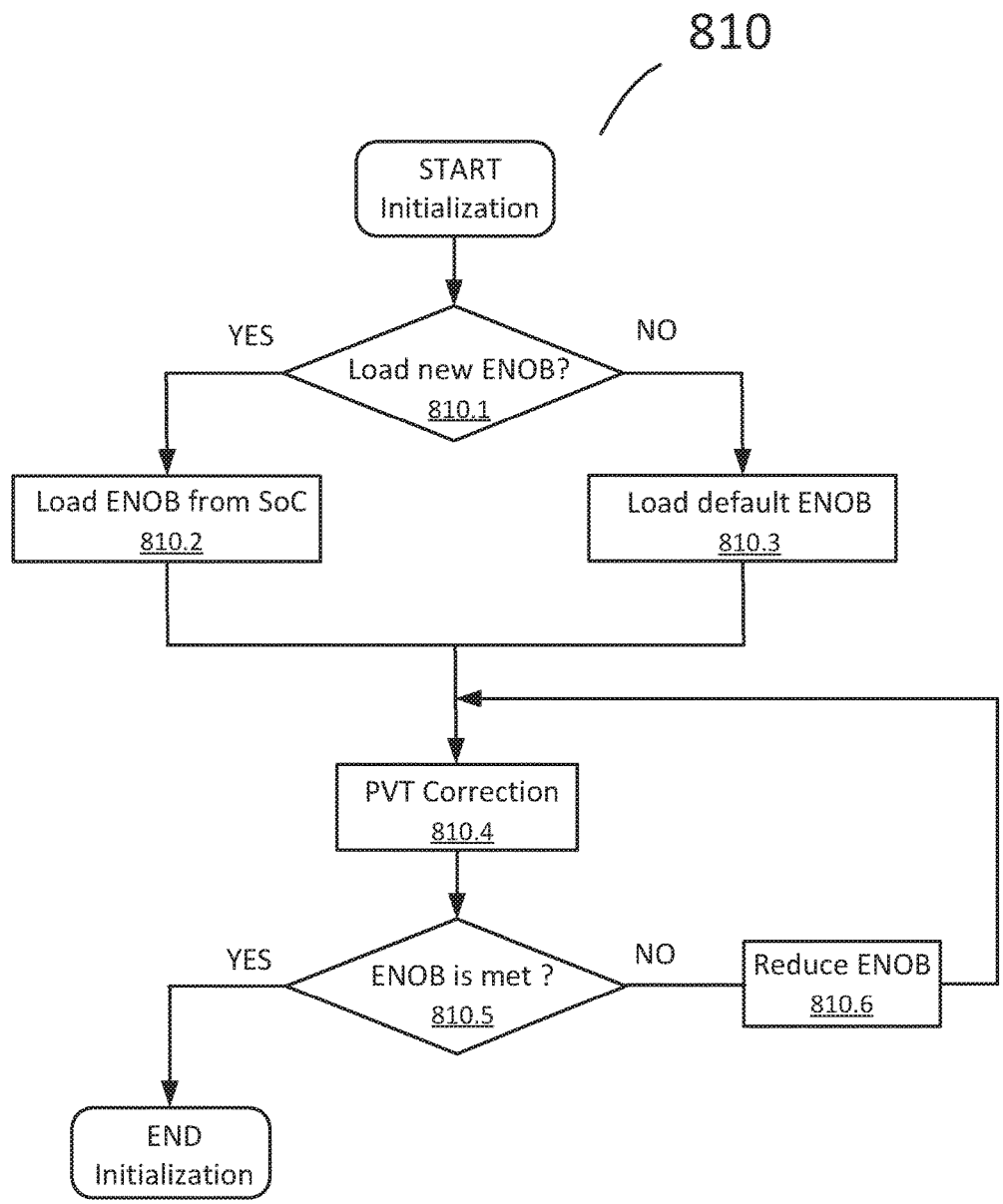
FIG. 8B shows the detailed flowchart of Initialization step for self-healing data converter process.

FIG. 8B illustrates the detailed flowchart of Initialization step 810. It uses the default ENOB 810.3 or loads the new ENOB requirement 810.2 from External System SoC. Then it goes to PVT Correction step 810.4 and check again after the correction. If ENOB is still not met after the correction, the target ENOB will be reduced to expedite the loop convergence and end the Initialization step.

Figure 8C:
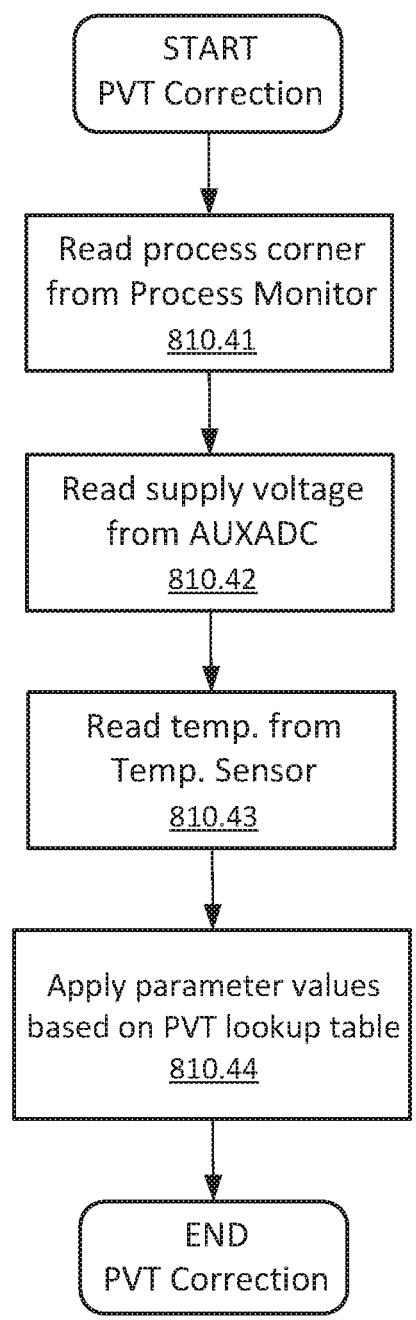
FIG. 8C shows the detailed flowchart of PVT Correction during Initialization step for self-healing data converter process.

FIG. 8C is the detail flowchart of PVT Correction step 810.4. It reads the process corner information 810.41, regulator supply voltage 810.42 and temperature 810.43 from Process Monitor, AUXADC and Temperature Sensor respectively. The collected process corner, supply voltage, temperature condition is compared with the PVT lookup table and produce optimal parameter values for the particular process, voltage and temperature (PVT) condition. The PVT lookup table is a reference that defines the ENOB performance versus data converter circuitry parameters with respect to the process, voltage and temperature condition. This PVT lookup table is obtained from the device characterization.

Figure 8D:
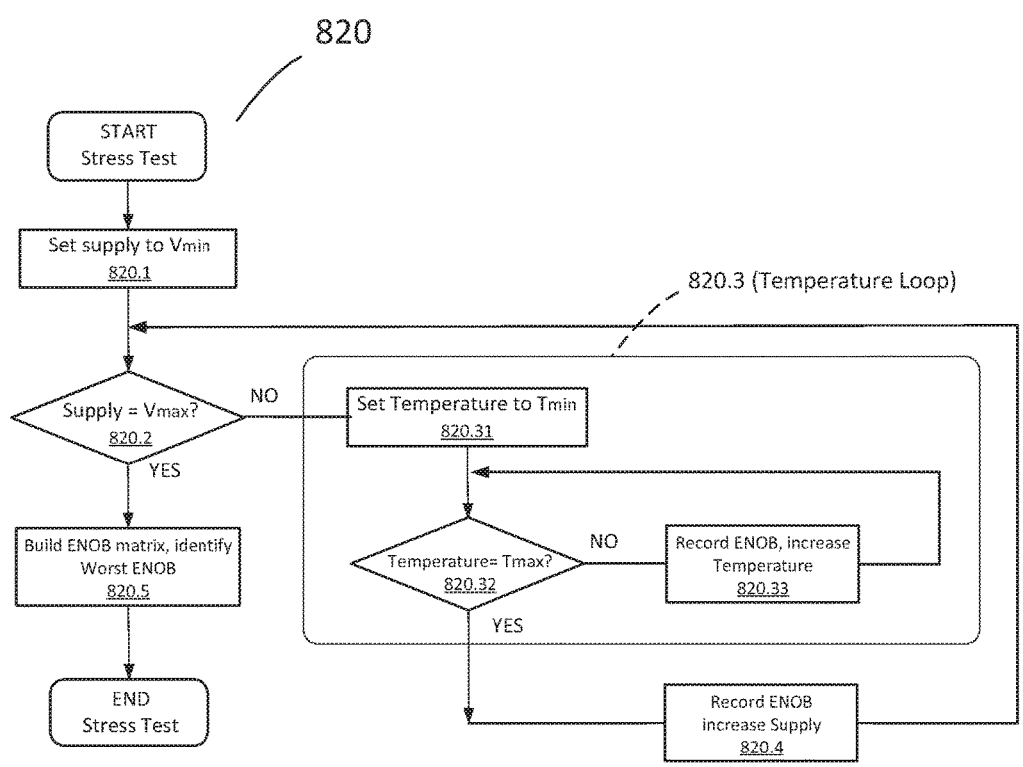
FIG. 8D shows the detailed flowchart of Stress Test step for self-healing data converter process.

FIG. 8D illustrates the detailed flowchart of Stress Test step 820. The Stress Test is to apply overstretched supply voltage and temperature condition, record the performance metrics and identified the weakest setting among the supply voltage and temperature combinations. First it sets the supply voltage to the minimum voltage $V_{min}$ 820.1 then steps up supply voltage till it reaches the maximum voltage $V_{max}$. Simultaneously, the temperature loop 820.3 sweeps the temperature from the lowest temperature $T_{min}$ to the highest temperature $T_{max}$. The performance metric ENOB is recorded for each test and a performance matrix table is built. Besides, the condition that yields the worst ENOB is identified and the parameter setting for this worst ENOB is recorded in step 820.5.

Figure 8E:
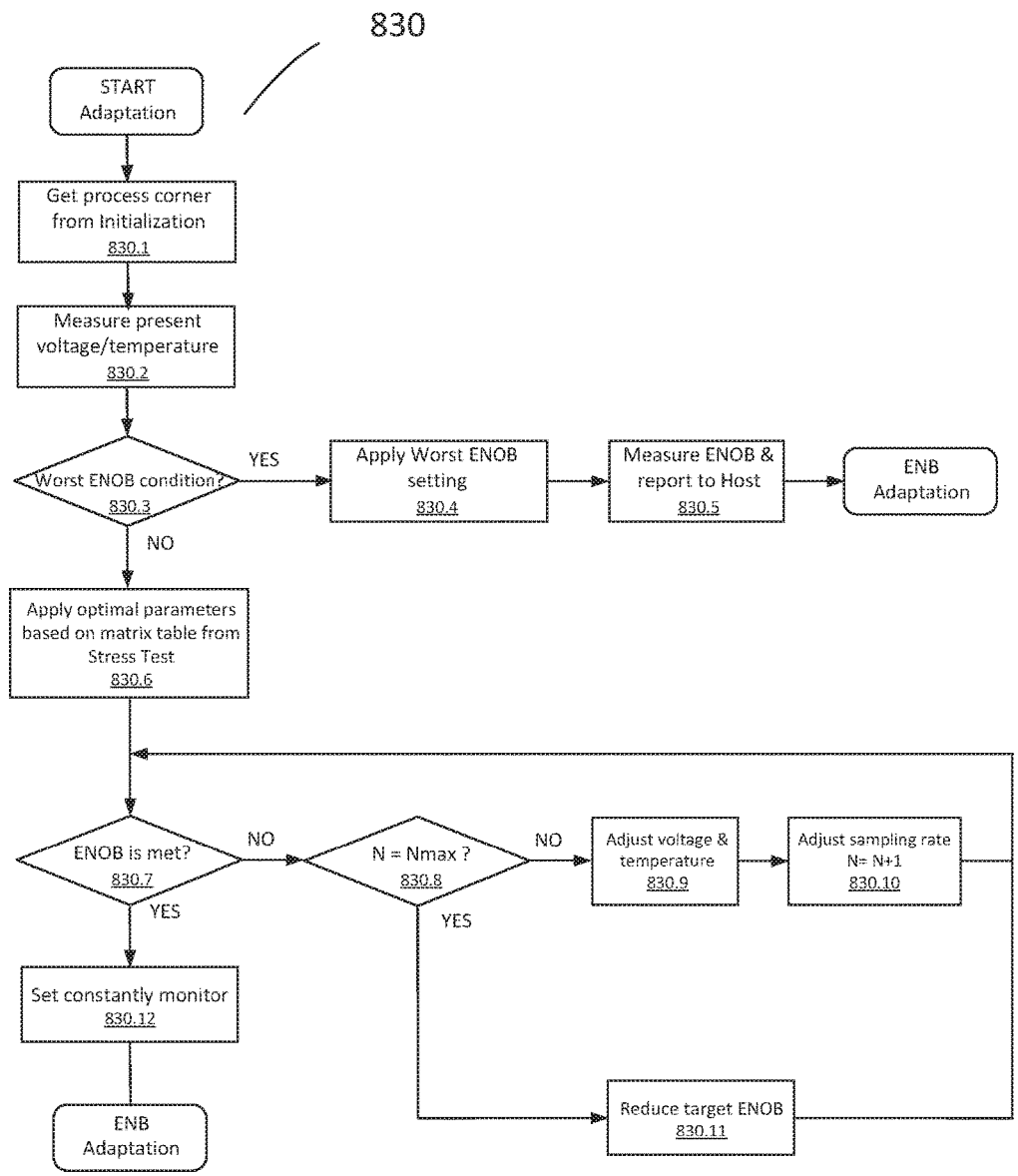
FIG. 8E shows the detailed flowchart of Adaptation step for self-healing data converter process.

After the Initialization step 810 and Stress Test step 820, the self-healing algorithm enters Adaptation step 830. FIG. 8E illustrates the detailed flowchart of Adaptation step 830. First it obtains the process corner information from earlier Initialization step. Then it measures the present supply voltage and temperature on the device 830.2. If the collected process, voltage and temperature (PVT) condition matches the worst ENOB condition 830.3, it will apply the worst ENOB setting 830.4, measure ENOB, report to Host 830.5 then end the Adaptation step.

If the measured PVT is the not the recorded worst ENOB condition, the algorithm computes a set of optimal parameters based on the performance matrix table from previous Stress Test step. The parameters are the design parameters that affect data converter performance such as supply voltage, temperature, reference current, reference voltage, timing delay, ADC full scale, OPAMP current, filter corner frequency etc. Once the parameters are applied to data converters 830.6, the ENOB of data converter will be assessed using Assistant Module and compared with the target ENOB. If the ENOB requirement is met 830.7, the algorithm will go to Set constantly monitor step 830.12 then end the Adaptation. This monitor step assigns a predetermined time to check the performance periodically. If for any reason the environment changes such as temperature drift or supply shift, the measured ENOB doesn't meet the target performance, the algorithm moves to step 830.8. An index N is initiated to be zero and the number of iteration $N_{max}$ is set to a designated number. In this step, it checks the counter index N to see if it has reached the designated $N_{max}$. If not, then it enters Adjust voltage & temperature step 830.9 and Adjust sampling rate step 830.10. The two steps 830.9 and 830.10 run a few iterations on supply voltage, temperature and sampling rate to improve ENOB. When the sampling rate is reduced, the signal has more time for settling and the dynamic performance of data converters is improved. If the evaluated ENOB still can't meet the target ENOB after $N_{max}$ step of iterations, the target ENOB will be decreased gradually 830.11. It keeps reducing the target ENOB until it meets the measured ENOB.

The step 830.3 of checking worst ENOB condition quickly identifies the worst condition and applies the setting that it already has recorded. Since it already knows the performance cannot be met during this specific condition, it can quickly converge and avoid going to the long iteration and having the convergence issue.

The system may experience a temporarily abnormal disturbance such as the geomagnetic storm in space or system under attack by hackers. Such an abrupt change or sudden stress strikes the device and causes the system run away from its normal operation. If the algorithm can't converge, the connection to the device will be lost and this results in destructive system malfunction. The procedures of reducing sampling rate and decreasing ENOB help the algorithm converge quickly in such a way that the system remains active and the connection to the host is retained. The system retrieves the target ENOB and returns to its normal operation after it recovers from the abnormal disturbance.

The self-healing data converter consists of the hardware implementation (FIG. 1 to FIG. 7) and the self-healing algorithm (FIG. 8A to FIG. 8E). The hardware functional blocks are configured based on the self-healing algorithm. The hardware functional blocks are categorized to three types of modules: Parametric Function Module 120, Assistant Module 130 and Processing Module 140. Parametric Function Module provides design parameters to data converters. Assistant Module provides input signals to data converters and also captures data converter output for assessing the performance. Processing Module collects the input, output analyzed information and compute the optimal parameters based on the self-healing algorithm. There are three main steps in the algorithm: Initialization 810, Stress Test 820 and Adaptation 830. Initialization step first loads the default target performance for example ENOB, then go through process, voltage and temperature (PVT) correction. Stress Test builds a matrix table on the data converter performance with overstretched supply voltage and temperature then identifies the worst performance condition. With the PVT correction and matrix table information, data converters are adapted to the environmental change such as voltage shift and temperature drift. Moreover, the self-healing data converter reduces the conversion rate or the target performance to avoid system failure and maintains the system robustness when there is an abrupt change that impacts the devices.

What is claimed is:

1. A self-healing data converter system, comprising:
   a data converter;
   a parametric function module coupled to the data converter to receive a target performance requirement for a data converter and produce a set of function values to the data converter;
   an assistant module that captures data converter performance under one or more stress conditions; and
   a processing module coupled to the data converter to stress the data converter in accordance with one or more predetermined parameters and based on the target performance requirement and data converter performance, the processing module determines new parameters based on a self-healing method and applies the new parameters to produce a new set of function values for the data converter until a predetermined threshold is met to adaptively self-heal the data converter to changed conditions, wherein a temperature module to adjust temperature is fabricated in a deep N well.

2. The converter system of claim 1, wherein the parametric function module comprises reference module, power supply module and temperature module.

3. The converter system of claim 1, wherein the assistant module comprises input source module and output analysis module.

4. The converter system of claim 1, wherein all functional modules are connected to the processing module for further processing.

5. The converter system of claim 1, wherein an ADC and an DAC form a loop back configuration to determine the data converter's dynamic performance at a predetermined conversion rate.

6. The converter system of claim 1, further comprising:
   a temperature sensor;
   a voltage controlled oscillator; and
   an inverter chain.

7. A method to provide a self healing data converter, comprising:

a) receiving a target performance requirement for a data converter;
b) producing a set of function values to the data converter and determining silicon temperature from a power dissipation of inverter chains;
c) capturing data converter performance under one or more stress conditions;
d) stressing the data converter in accordance with one or more predetermined parameters;
e) based on the target performance requirement and data converter performance, determining new parameters based on a self-healing method and applying the new parameters to produce a new set of function values for the data converter; and
f) iteratively repeating (b)-(d) until a predetermined threshold is met to form an adaptive self-healing data converter system.

8. The method of claim 7, comprising:
generating a performance matrix table for process corner, supply voltage and temperature; and
identifying a condition that yields a worst performance among process, voltage and temperature combinations to bypass long iteration and expedite the loop convergence.

9. The method of claim 7, comprising adapting the data converter to an environmental change based on a performance matrix table from process, voltage and temperature correction.

10. The method of claim 7, comprising setting a reduced conversion rate or decreased target performance to prevent non-convergence that causes a disconnection or a system failure.

11. The method of claim 7, comprising determining power dissipation of an inverter running at selected clock frequency as, where
P is the power dissipation,
f is clock frequency,
C is capacitance, and
V is supply voltage.

12. The method of claim 7, comprising changing power dissipation and silicon temperature by changing supply voltage.

13. The method of claim 7, comprising placing a temperature module in a deep N well proximal to the data converter.

14. The method of claim 7, comprising determining performance metric including one or more of: Integral Non Linearity (INL), Differential Non Linearity (DNL), Spurious-Free Dynamic Range (SFDR), Signal-to-Noise Ratio (SNR), Total Harmonic Distortion (THD) and Effective Number of Bits (ENOB).

15. The method of claim 7, comprising determining user specific performance metrics.

16. The method of claim 7, comprising:
collecting process corner, supply voltage, temperature condition and comparing with data in a design lookup table; and
generating parameter values for the particular process, voltage and temperature (PVT) condition.

17. The method of claim 16, wherein the design lookup table is a matrix that defines the ENOB performance with respect to functional parameters and obtained from device characterization.

* * * * *